(12) United States Patent
Cooper et al.

(10) Patent No.: US 8,407,033 B2
(45) Date of Patent: Mar. 26, 2013

(54) SYSTEM FOR MODELING DYNAMIC RESPONSE CHANGES IN AN ANTHROPOMORPHIC DUMMY

(75) Inventors: John Cooper, Oxford, MI (US); Michael Beebe, Norwalk, OH (US); Dave C. Stein, Troy, MI (US); Craig Morgan, Bloomfield Hills, MI (US)

(73) Assignee: Humanetics Innovative Solutions, Inc., Plymouth, MI (US)

( * ) Notice: Subject to any disclaimer, the term of this patent is extended or adjusted under 35 U.S.C. 154(b) by 383 days.

(21) Appl. No.: 12/819,824

(22) Filed: Jun. 21, 2010

(65) Prior Publication Data

US 2011/0144955 A1 Jun. 16, 2011

Related U.S. Application Data

(60) Provisional application No. 61/269,397, filed on Jun. 23, 2009.

(51) Int. Cl.
G06G 7/48 (2006.01)

(52) U.S. Cl. .............................. 703/6; 703/1
(58) Field of Classification Search ........................ 703/6
See application file for complete search history.

(56) References Cited

U.S. PATENT DOCUMENTS

| 4,488,433 A | 12/1984 | Denton et al. | |
| 5,317,931 A | 6/1994 | Kalami | |
| 5,526,707 A | 6/1996 | Smrcka | |
| 5,528,943 A | 6/1996 | Smrcka et al. | |
| 5,589,651 A | 12/1996 | Viano et al. | |
| 5,695,242 A * | 12/1997 | Brantman et al. | 297/216.1 |
| 5,741,989 A | 4/1998 | Viano et al. | |
| 6,836,754 B2 * | 12/2004 | Cooper | 703/8 |
| 6,982,409 B2 | 1/2006 | Huang et al. | |
| 7,086,273 B2 | 8/2006 | Lipmyer | |
| 7,627,459 B2 * | 12/2009 | Volovoi | 703/6 |
| RE42,418 E | 6/2011 | Lipmyer | |
| 8,086,430 B2 * | 12/2011 | Thomas | 703/8 |
| 8,296,109 B2 * | 10/2012 | Feng et al. | 703/7 |
| 2006/0095235 A1 * | 5/2006 | Furtado et al. | 703/1 |

OTHER PUBLICATIONS

Kirkpatrick et al, "Finite Element Modeling of the Side Impact Dummy (SID)", SAE Technical Paper 930104, 1993.*
Kirkpatrick et al, "Development of an LS-DYNA Occupant Model for Use In Crash Analysis of Roadside Safety Features", TRB Annual Meeting, 2003.*
Tass, "Madymo Version 7.0", datasheet, downloaded Aug. 29, 2012.*
Park et al, "Frontal Offset Crash Test Study Using 50th Percentile Male and 5th Percentile Female Dummies", Proceedings of 16th International Technical Conference on the Enhanced Safety of Vehicles, 1998.*

* cited by examiner

Primary Examiner — Mary C Jacob
(74) Attorney, Agent, or Firm — Bliss McGlynn, P.C.

(57) ABSTRACT

A system and method for designing a crashworthiness system is taught. The system utilizes computer models of anthropomorphic dummies having material properties which change as a function of time.

15 Claims, 4 Drawing Sheets

SYSTEM FOR MODELING DYNAMIC RESPONSE CHANGES IN AN ANTHROPOMORPHIC DUMMY

CROSS-REFERENCE TO RELATED APPLICATIONS

This application claims the benefit of U.S. Provisional Application No. 61/269,397, filed on Jun. 23, 2009. The entire disclosure of the above application is incorporated herein by reference.

FIELD

The present disclosure generally relates to anthropomorphic test dummies. In particular, the disclosure relates to a system for modeling time dependent dynamic response changes in anthropomorphic test dummies.

BACKGROUND AND SUMMARY

This section provides background information related to the present disclosure which is not necessarily prior art.

The allowable variation in physical anthropomorphic test dummies presents an issue with respect to building a predictive simulation model. In this regard, a finite element model for an anthropomorphic dummy will have a single response for a given input whereas different physical dummies of the same type will give a range of responses for the same input. The inherent dummy variability is a byproduct of the dummy response corridors and specifications, in part set by government regulators. Due to dummy variability, simulation models cannot be more predictive than the variation range of the physical dummy.

An example of how dummy variability can affect a test result can be seen with respect to a head acceleration test. The head acceleration allowed in the head drop certification test for a Hybrid III head is 225 g to 275 g equivalent to 250 g +/−10%. Head injury for frontal dummies is measured in HIC (Head Injury Criteria) and is a calculation based on head acceleration. The HIC calculation would then have an allowable variation for a dummy head of +/−27%.

While not all injury criteria are as sensitive to variation as HIC, the allowable dummy response corridors still have an effect. When considering the total dummy calibration variation as a whole, the range of dummy performance produced can create at least a one star variation in the proposed 2011 U.S. NCAP procedure.

Due to such variation, an OEM could perform a crash test in its own laboratory and achieve a particular U.S. NCAP star rating that could then vary by at least one star rating if the car is tested in another laboratory with a different dummy calibrated in a different lab. In order to better predict the results of a crash test, it is desirable to for a dummy simulation model to account for variation due to allowable response corridors.

For a simulation model to account for sources of variation, it is important to identify the sources of variation and identify the sensitivity of the variation on the product performance. Sources of variation include the following: mass variation for a given component; inertia variation for a given component due to mass variation and center of gravity location; material property variation with time; material property variation from batch to batch due to ambient conditions, procedural variations, temporal variations, environmental variations, and operator changes; material dimensional variation with time; material performance variation due to Mullins effect on rubber and vinyl; final part dimensions compared to CAD data; variable wall thickness of the molded parts (for vinyl only as urethane/silicone molds produced solid parts) around the periphery and along the length of a mold, especially true in areas with blend radii and could be due to different operators, different mould temperatures and different amounts of material entered into the mould—for vinyl the dwell process and how quickly the operator empties a mould after initial filling may affect this; voids in the foam; variable foam density throughout the foam volume; part variability due to operator and production process variation not mentioned above; assembly stress variation due to preloading during assembly i.e. jackets and zippers; dummy assembly set-up variation due to dummy joint settings; test setup variation during calibration, such as random errors, procedural variations, calibration uncertainties, operator variations, lab-to-lab variations, environmental factors; and instrumental variation, such as cross talk, sensor alignment, and sensor calibration.

The accuracy of sensor output may also be assessed to determine its effect on the test. For example, if a 10 kN full scale load cell has a non-linearity of 0.75%, it can have an error of 75N. If the load cell output is used in a test result with a 300N peak, the data could therefore be in error by 25%.

With respect to crosstalk of detected signals, it can have a 5% error on a channel. It is assessed during calibration as the effect on an unloaded channel when other channels are loaded and is typically a value proportional to the applied force on the loaded channel, i.e. lower forces result in lower absolute crosstalk values. Load cell accuracy may also have an effect on test output.

The total variation seen in dummy performance has significant contributions from the dummy hardware, the certification test method, and the instrumentation used. All three areas should be investigated if variation is to be accounted for.

If the dummy is improved and the variation in the physical product is reduced, then both the test method and instrumentation equipment used should both be able to show the improvement in the hardware product repeatability.

For the testing, this may involve a method of assessing the test performance independently of the hardware product. For example, a head and neck pendulum test would have a mechanical component assembly (mechanism) with integrated instrumentation, designed to produce and measure upper and lower neck loads and moments along with head accelerations. This mechanism quality would meet all A2LA requirements with respect to variability and repeatability. A similar device would be created for every certification piece of equipment.

Geometry: Models can be created using accurate external geometry of the dummy. Geometry data is collected in a variety of ways including surface scanning, CT Scanning, X-ray and use of CAD data that represents a designed part. Variations in material wall thickness for vinyl and Urethane parts are typically not considered with a nominal wall thickness used throughout a molded part. In many cases the Vinyl and foam parts are not represented by two different materials but as one material with a combined material characteristic.

Material Test Data: Dynamic material test data can be used by the simulation model and can only represent a single material test result from a range of test conditions. The material models used in the simulation represent a portion of the complete material model design space. No account is made for Mullins effect in the visco-elastic material properties or other material changes over time.

Component Mass: Many models use a single mass condition. Each part is modeled separately and the model mass is compared against the mass tolerance for that part. The model mass is considered acceptable if within the tolerance range.

Inertia Properties: Inertia properties in the finite element models are a by-product of the mass and geometry data used in the model. Inertia properties are compared to calculated properties via the CAD data. The inertia property of a physical model can vary based on material and geometric changes in the dummy.

Dummy Joints: Dummy joints in the FE models are represented using kinematic joints similar to a Madymo lumped mass joint. Joint properties can be estimated rather than determined through testing or against theoretical data. (Joint friction can be set with a "1 g" test. This is tightening the joint to the point it will not fall under its own weight. This test subject to operator technique and in some applications cannot be done for every dummy joint.)

Contact Interactions: Contact strategies for models can vary depending on the software used. A self-contact strategy can be used, but variables including penalty stiffness can create a significant variation in contact performance and model response.

Pre-Stress Parts: Dummy Jackets and other dummy components can create internal stresses within themselves and on other components when they are assembled into their final position. Typically, pre-stress conditions are not accounted for in the models, except to produce numerical stability. In addition, variation in the pre-stress condition caused by a variation in the component tolerances between dummies is not taken into account. For example, this can occur due to variations in the placements of the jacket zippers.

Mesh Density: Typically, mesh density is limited in a model to produce a solution time step of $10e^{-06}$. However, vehicle models are moving from 2-5 million to 5-10 million elements for the complete vehicle. Accuracy typically increases as mesh density increases. The dummy model can have a mesh density that is similar to the vehicle model. This helps reduce contact related modeling issues and tends to increase the accuracy of the models. Thus, the number of elements needed in a finite element dummy model may increase in line with the number of vehicle elements. Existing models can be updated accordingly.

Numerical Material Performance: Typical dummy models have a wide range of material performance. It is difficult for software companies to gain access to the correct samples for a given material. It is also difficult to then collect the material performance data under the correct load conditions. Rubber, vinyl, urethane, and foams are under a large deformation and have a high non-linear performance. In addition, these materials change their performance with a change in strain rate. It is desirable to collect material properties at the correct load conditions. It is also desirable to have test samples that represent dummy materials in their production condition. A number of new dummy drawing specifications will be needed for the materials of different components that are not currently specified in enough detail.

Instrumentation Content: There are various methods to model the instrumentation content of a dummy. For example, a model supplier may issue a given dummy model with a specific set of instrumentation included. The customer may use this model even though the dummy used in testing might have a different level of instrumentation included. Differences in instrumentation content within the model compared to the tested dummy can produce variation in the dummy total mass. Localized mass differences can then affect the dummy response. Current models do not account for these types of variations.

Generally, modeling variability includes the following steps: 1) determining the level of variation; 2) determining why the variation is present and the cause of the variation; 3) determining how easily the variation can be modeled; and 4) determining a process for modeling the variation.

Variation Level: Variation level can be determined through testing and generally includes material tests, component tests, and assembly system tests. For each test, a range of data at each level is generated that indicates the variation in performance. This can be done using a controlled experiment where potential sources of variation are identified and the testing is then completed such that the effect of the variation sources is demonstrated in the test results. Sources of variation in performance come from the dummy component and the test method used.

Reason For, and Cause Of, the Variation: At each stage of production and/or testing, the level of variation is identified and modeled. Variation can come from the dummy component and the manner in which the component is tested. An optimization method utilizing a genetic algorithm is used to find the optimal level of dummy and test variables. After a solution is determined, a design of experiment (DOE) is run around this condition using the defined variables. This identifies the effect of each variable on the variation.

As discussed above, there are two primary sources of variation, one from the dummy and one from the test. The optimization process uses input from both sources and is then able to identify the effect of the test and the dummy variation. The cause of the variation (by a variable) can be determined through the simulation. This is a natural output of the optimization process. Once the source of the variation is known, the reason for it occurring can be determined.

In addition to confirming the cause of the variation, the simulation process determines the magnitude of variation for a given source of variation. After the variation sources are identified and their effect is quantified, a repeat series of tests can be completed where the variation sources are minimized. The expected results are a reduction in the variability of the given performance. If this is not achieved, then steps 1 and 2 can be repeated until the desired level of improvement (reduction in variation and confirmation of the variation source) is achieved. This process improves the way the product is designed, manufactured, tested (repeatability) creating an increase in performance of the product (consistency).

From the work completed in steps 1 and 2 described above, the sources of variation will have been identified. The modeling process used identifies the variation source and its effect. Repeat testing helps determine if the simulation process produced the correct result. By default, the simulation shows that the variation can be modeled, but it is also desirable to know how easy it is to model the variation.

Material properties, mass, inertia, joint stiffness, cable tension, temperature effects, changes in test set up (initial positioning and impact energy) are relatively easy to model. Material thickness variation (vinyl thickness), anisotropic material properties, changes in surface shape, and volume are relatively difficult to model. The test and simulation process identifies the variation source and the magnitude of its effect. As such, it is then possible to identify which variables have the largest effect and how easy they are to model.

Process for Modeling the Variation: Material properties, temperature, mass and inertia variation will often have a dominant effect on dummy performance. During testing, it is likely that the initial positioning and impact energy variations will have the dominant effect on dummy performance. Model variations are normally made by introducing physical (manual) changes to the model input file. Using data from step 3, a modeling process can be developed to increase the ease in which a dominant variation source can be modeled.

Once the variation source is known and its effect is understood, the most important variation modeling processes can be prioritized.

DRAWINGS

The drawings described herein are for illustrative purposes only of selected embodiments and not all possible implementations, and is not intended to limit the scope of the present disclosure.

Corresponding reference numerals indicate corresponding parts throughout the several views of the drawings.

DETAILED DESCRIPTION

Figure 1:
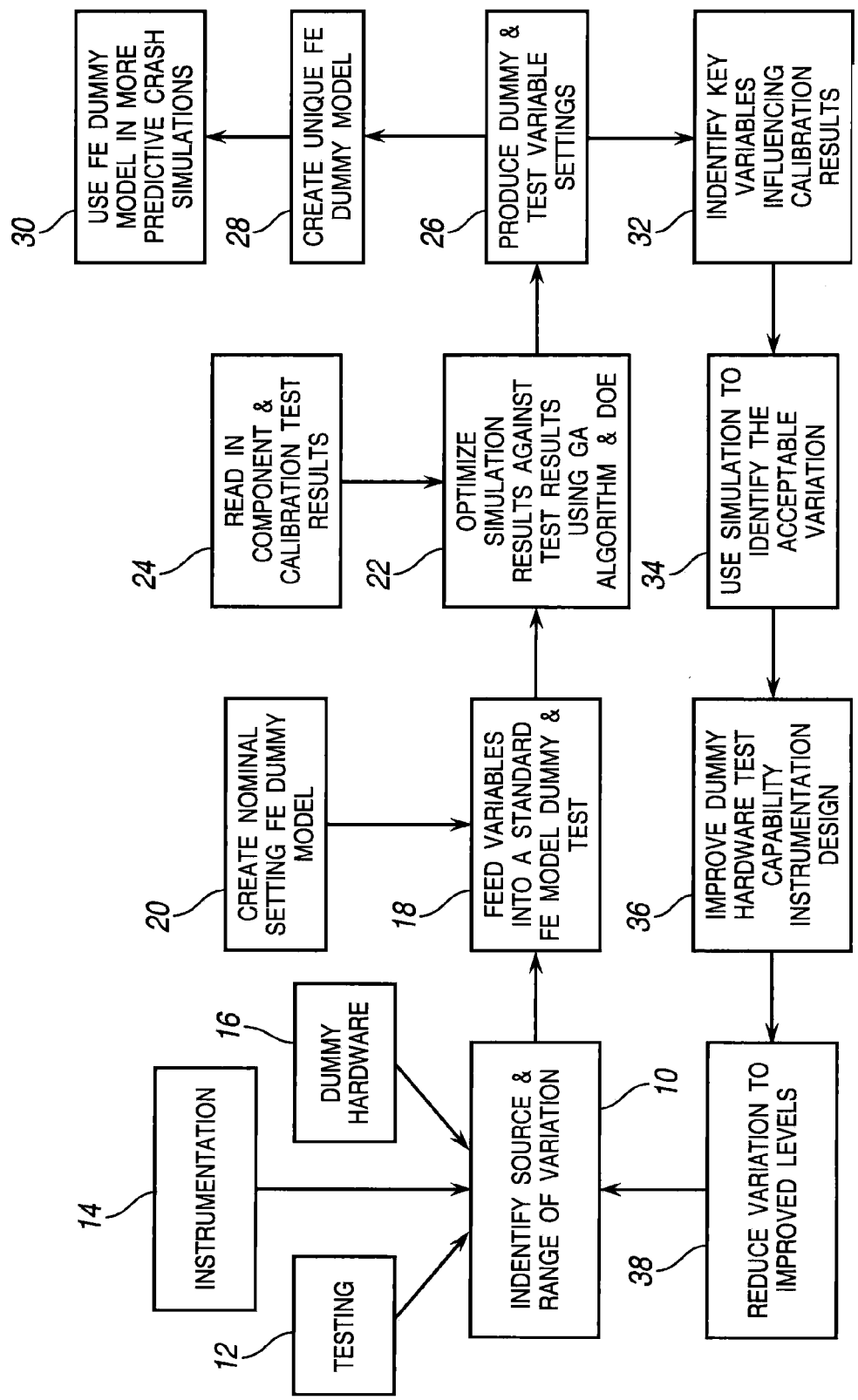
FIG. 1 is a flowchart according to an aspect of the present teachings that describes operation of a tool that processes variability and produces a finite element model of a specific anthropomorphic test dummy.

Example embodiments will now be described more fully with reference to the accompanying drawings.

The present disclosure includes an automated tool that processes variability and produces a finite element model of a specific anthropomorphic test dummy. The tool generally includes four components.

The first component includes a database of dummy models and test set-ups.

The second component includes a software package that can read in dummy certification test results and component test results. This test data can be used to modify the material properties of the elements or bars of the finite element model.

The third component includes an analysis package that automates the use of an optimizer and a numerical solver. The optimizer is a combination of a genetic algorithm tool and a design of experiment capability. For example, the HEEDS genetic algorithm developed by Red Cedar Technology of East Lansing, Michigan can be used. The algorithm is formatted to solve this specific type of problem and is embedded in the tool in a manner such that the user does not need to be an optimization expert.

The fourth component includes a pre and post graphics user interface (GUI) that reduces the user work to a minimum. The GUI reads in the test results, formats the optimization study, and runs the study in an automated format. Optimization results are displayed in a clear manner emphasizing clarity of the conclusions.

Further discussion of each of the components is provided below. With respect to the dummy database, it has the complete dummy and all the related component dummy models in their respective component or system related test set-ups. For a given component and test set-up, the recognized sources of variation are predefined based on prior analysis.

A flowchart describing the operation of the tool is set forth at FIG. 1 and is described below.

The software sets up the HEEDs optimization runs needed for a given dummy model or component model. The test results are read in from an external file by the user and are used to compare the validation of the dummy model and test set up. Dummy and test variables are optimized until simulation results match actual test results.

For each individual and combined test load case (head drop, neck pendulum, chest deflection, etc . . . ) the optimization produces a set of dummy and test set-up settings that produce the best fit against the supplied test results.

The dummy model settings are then transferred to a dummy model input file to create a model that has a unique calibration against a specific dummy calibrated in a specific laboratory by a specific technician on a given day. This model can then be checked for performance in a range of standard test conditions.

The test set-up settings are also inserted into a table and compared against the standard set up conditions. Differences between the optimized settings and the standard are noted.

After the optimization process, a separate design of experiment (DOE) can be run using the optimized settings. The DOE analysis will investigate the sensitivity of a given setting on the related results. Once complete, the significance of a given dummy setting and test set-up setting will be known and is presented.

The direct output from the analysis is a dummy model having a unique calibration and a list of dummy and test settings that achieved that calibration. The sensitivity of a given variable on a dummy response is also generated. Therefore the user will be able to quantify the greatest sources of variation (dummy or testing) and their effect in the location where the dummy was certified.

The simulation tool is encapsulated into a GUI environment that minimizes the effort to complete the analysis and present the results. In some applications, the user will only have to identify which dummy model is used and the location of the test results in order to complete the analysis.

The simulation described above can be used to identify the sources of performance variation. This can be done manually instead of using the GUI. Typically, the test and dummy variation sources must be known before the GUI is created.

Figure 4:
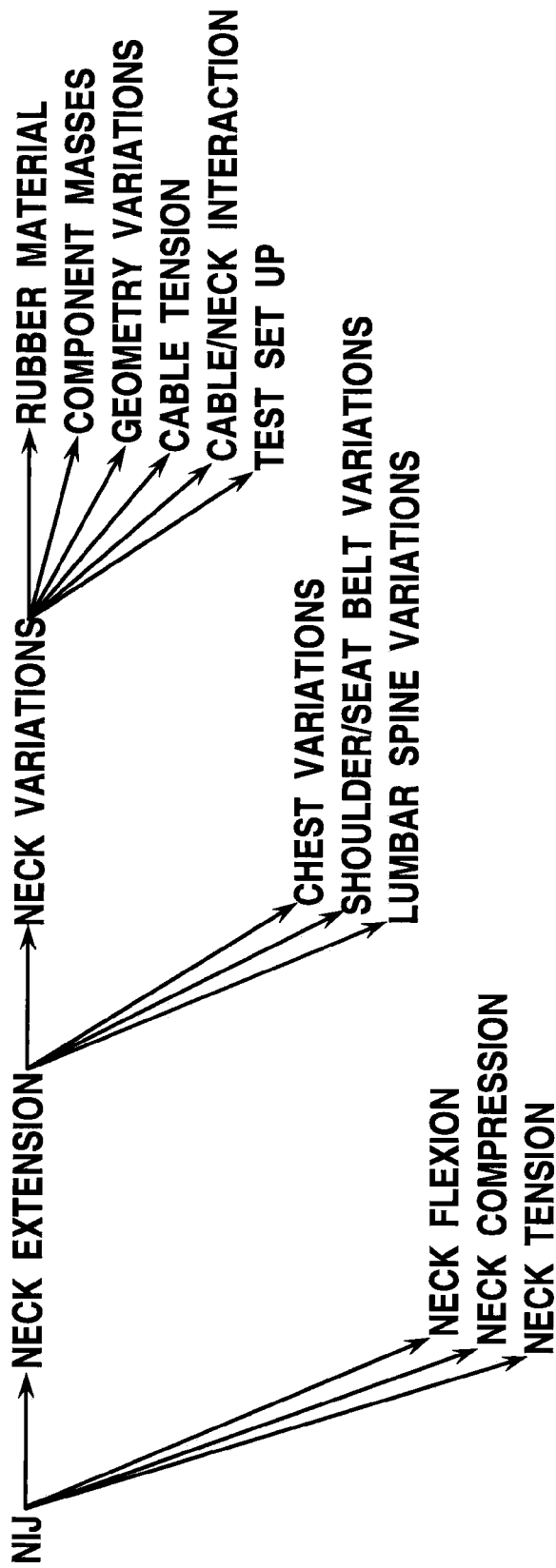
FIG. 4 represents a tree structure depicting possible sources of variations in the neck NIJ calculation according to the present teachings.

As shown in FIG. 4, for each individual dummy response the potential dummy and test variation sources are defined via internal discussion. These variations are collected in a tree structure diagram. By way of non-limiting example, the neck NIJ response for a HIII 50$^{th}$ percentile is considered. The above can be created for each dummy certification response creating a comprehensive document showing all areas of variation and their linkage back to the dummy test result.

Once consensus is achieved, the related simulation models are set up and the optimization is run. The optimization output identifies which variable has a significant affect on the dummy test result.

Once these variables are identified and prioritized, a repeat sequence of tests are completed using the dummy and test set-ups in a more controlled way to prove that the source of variation and its effect is correct.

Ultimately, the tree will also identify the significance of a variation and the plan to physically quantify, remove, or reduce the variation.

Not all dummy variation has a significant effect on key legislation/industry standard injury criteria. To facilitate the process of minimizing the effect of variation, it is important to select the most dominant criteria, identify the allowable variation, identify the variation sources, and remove the variation.

To do this, relevant industry standards are reviewed and the key factors contributing to an injury value are identified. This can be completed for each dummy type and each application use. For example, in comparison to global legislation requirements the USNCAP and EuroNCAP play a dominant role in identifying the key injury criteria for frontal side impact and rear impact dummies.

A series of dummy results from a range of vehicle crash tests are selected and it is assumed that the injury response is created with a dummy calibration set in the middle of the response corridor. The dummy results and injury response for a dummy at the top and bottom end of the corridor are recomputed. This produces a range of dummy injury response for a given calibration corridor. Using the calculated range in performance the importance of a given calibration corridor is identified and the effect of the allowed dummy variability is quantified.

Typically, for the 2011 USNCAP and the Hill $50^{th}$ the dummy variability has the greatest impact on the NIJ and chest deflection results. For the SID II's it is typically the pelvic force and for the ES II RE it is typically the rib deflection and abdominal force that have the greatest impact with respect to variability.

As set forth above, material properties, temperature, mass, and inertia variation can have a dominant effect on dummy performance. In the testing the initial positioning and impact energy variations can have a dominant effect on the dummy performance.

Current drawings and test specifications often do not discern possible performance differences between dummies, causing a wide range of possible dummy performances in the vehicle crashes. Thus, there is a need for additional specifications that are not currently part of any government or regulatory specifications. Generally, there are three deficiencies in current specifications that are subject to improvement: 1) drawing packages (tolerances, weights, CG, no MOI, materials); 2) incomplete external shape definition; and 3) certification test procedures and specifications. The present disclosure addresses these deficiencies as set forth below.

With respect to the drawing packages, increased specifications of materials are used. For example, additional material plug testing is used that meets Gage R&R with the appropriate property measurements, such as static stiffness, damping, etc. Refined tolerances are also used to provide better and more consistent fits. The center of gravity (COG) and equipment and procedures (to meet a gage R&R) are refined and the information is distributed to customers. This reduces the weight and the COG variation.

A moment of inertia (MOI) measurement device and procedure (to meet a gage R&R) is also developed and distributed to customers. This reduces the MOI variation and is particularly significant as a result of the increased use of on-board data acquisition systems (DAS). Finally, process controls and monitoring methods of measurement are developed to create a more consistent material and component production.

With respect to the external three-dimensional shapes, dummy shapes are distributed through the FE models, which can be used to compare dummies against scanned data. Primary measurements to check shapes are provided so users do not need to scan each dummy to do any overlay.

With respect to the certification tests, current certification tests generally do not meet an ASTM Gage R&R. Therefore, current tests generally cannot adequately discern performance variations between dummies. As a result, the present disclosure provides for certification supplements to users. This will reduce lab-to-lab variation and includes items such as complete procedures for tools and measurement devices to set cable torque in the dummy.

The present disclosure provides for a separate set of component tests (that meet a Gage R&R), which affects both the certification tests variation and the whole body system variations. Both modeling efforts and sled testing in hard seats will be used to quantify the improvements. These new tests will be distributed to users to help them reduce variation between their simulation and testing results.

The present disclosure provides for the following outputs: comprehensive material model database; simulation models that identify the effect of a dummy variable and test variable; simulation tool set (GUI) specification; dummy models with a unique calibration setting; isolation of the effect of test variables from dummy variables; a list of component test and certification test improvements; extra in-house tests to control manufacturing, such as MOI measurement fixture, joint resistance measurement fixture, bending tests for lumbar spines, complete set of CG measurement equipment, and axial loading in lumber spines and necks; a complete set of new dummy design guide lines (what not to do); an ability to access new dummy designs for variability; use of different materials that have reduced variation potential; an ability to create and assess certification test protocols for new dummies as part of the dummy development program; and a standard for certifying dummy certification labs that does not use dummy components.

With reference to FIG. 1, many features of the present teachings are set forth in the form of a chart. With initial reference to process block 10, the present teachings provide for identification of the source of and range of dummy variation through testing at process block 12 using instrumentation at process block 14, and dummy hardware at process block 16.

At process block 18, the variables are inserted into a finite element (FE) model dummy and tested. The nominal setting finite element dummy model is created at process block 20. At process block 22, simulation results are optimized against test results using a genetic algorithm and design of experiment. Component and calibration test results are read in at process block 24.

Dummy and test variable settings are produced at process block 26. The settings are ultimately used at process block 28 to create a unique finite element dummy model, which is used at process block 30 in more predictive crash simulations. However, prior to creating the finite element dummy model at block 28, the variation can be further reduced by proceeding with process blocks 32-38.

At process block 32, key variables influencing calibration results are identified. Simulation is used at process block 34 to identify acceptable variation. At process block 36, dummy hardware test capability instrumentation design is improved. Then at process block 38 variation is reduced to improved levels. Subsequently, process blocks 10-26 are repeated to arrive at an enhanced unique finite element dummy model at process block 28.

Figure 2:
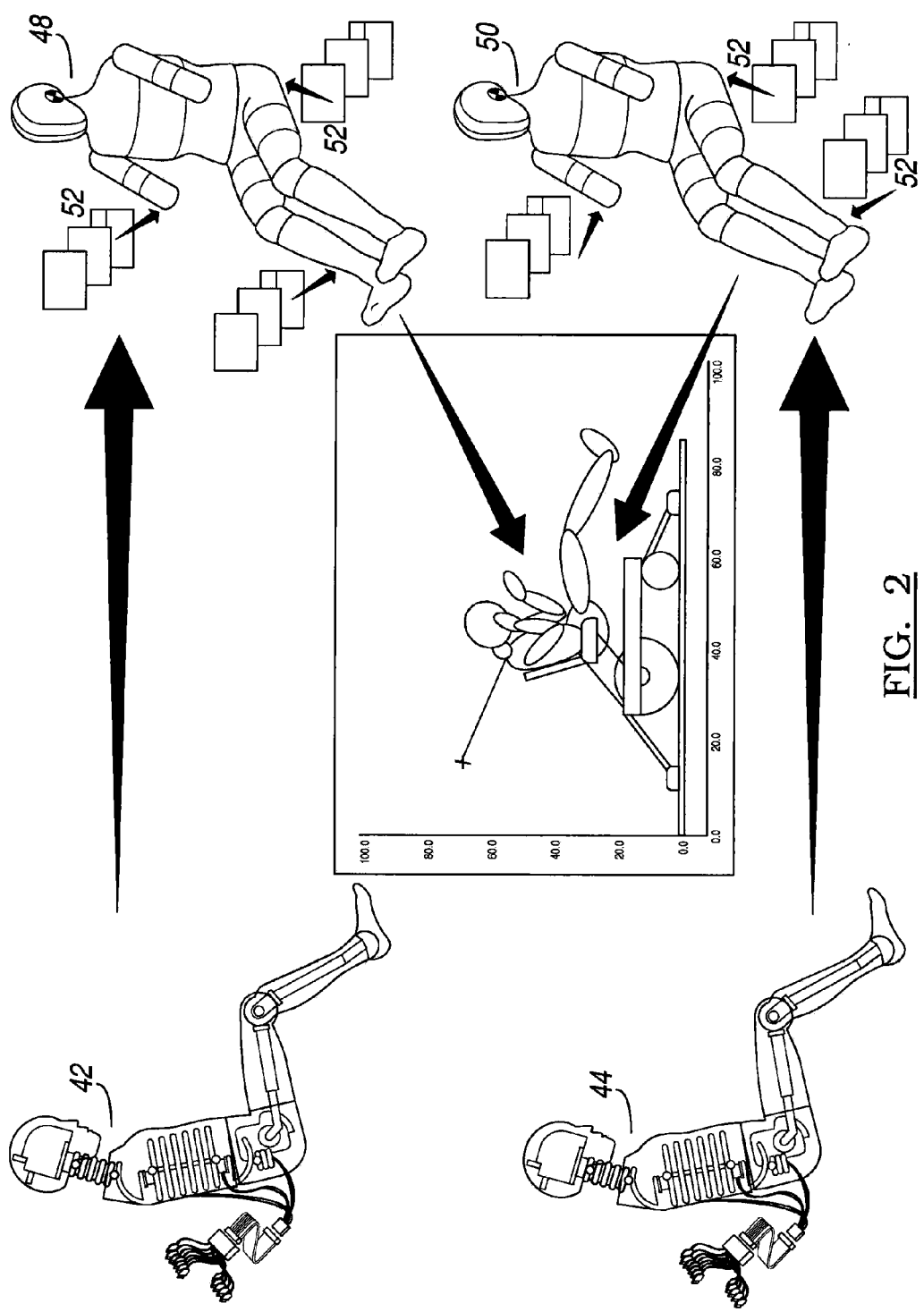
FIG. 2 represents a system diagram according to the present teachings.

FIG. 2 represents a schematic diagram showing formulation of a crash model according to the present teachings. As previously mentioned, every anthropomorphic dummy has variation in its components due to production tolerances and atmospheric variables. Additionally, it has been found that the anthropomorphic dummies undergo dimension and material changes over time due to aging. These material and dimensional changes can effect the overall response of a restraint system designed using these dummies. Additionally, as computer crash models are validated using vehicle or sled tests, these models can be improperly created if changes in dummies cause misleading or different results.

Shown are first and second Hybrid III dummies 42 and 44 of the same model/size which are used in sled or vehicle tests. As is known, these dummies 42 and 44 can be replaced using other dummy types (i.e. SID, Euro SID, $5^{th}$ female, $95^{th}$ male, or child) to evaluate the effectiveness of a restraint system in various crash scenarios with various sized occupants.

Because of the cost of running sled and vehicle crashes, often restraint system design and validation is conducted using FEA crash models such as, for example, Dyna LS or Madymo. Finite element models 48, 50 are formed for the first and second Hybrid III dummies. These finite element models are formed of linked model elements 52 having defined material and dimensional properties. As better described below, the material properties of these elements is stored in a data structure for use in the vehicle crash simulation. The material and dimensional properties of the various elements vary as a function of time. In this regard, while traditional FEA dummy models have average fixed material properties, the models according to the present teachings have elements having associated data structures which predicatively anticipate changes in the material properties in the dummy over time. Associated with the element can be a counter indicative of the age of the dummy component. This counter can be used in conjunction with the material property function or table stored in the data structure to set the material properties in the model.

In the event the Hybrid III dummy gets damaged during testing, a replacement component is used to repair the damaged component. At this point, the FEA model for the specific Hybrid III dummy can be amended to include the new component associated material data as well as a component life counter.

These models can then be used in the FEA crash simulation model to predicatively determine what results will occur using the second Hybrid III dummy. The model for the second Hybrid III dummy can also be incorporated into the FEA crash model.

Figure 3:
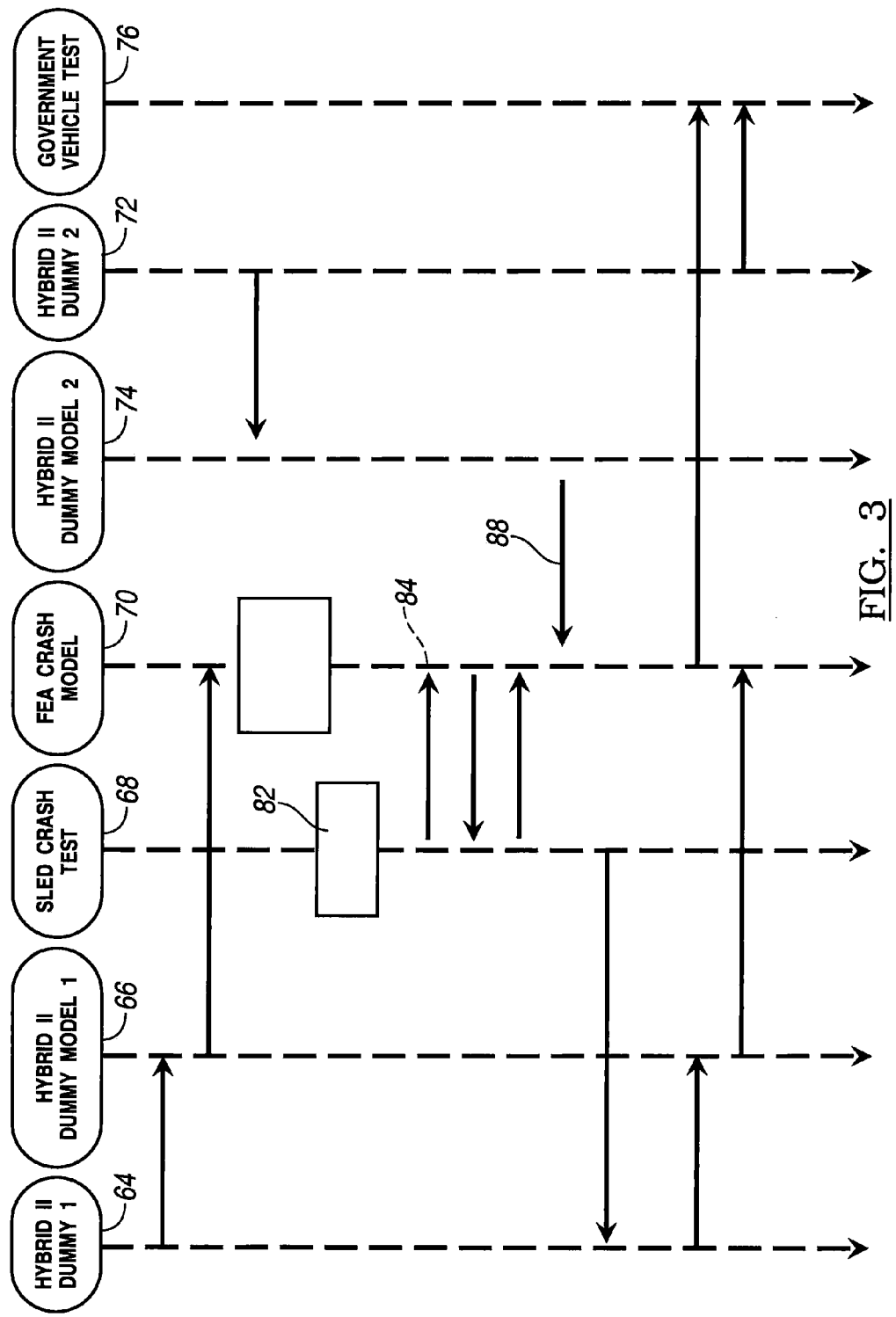
FIG. 3 represents components used to design a restraint system according to the present teachings.

FIG. 3 generally refers to a method for designing a restraint system using the dummy models having elements with time dependent material properties as described above. Shown is the interaction of various design tools over time. These design tool include a first Hybrid III dummy 64, a first Hybrid III dummy model 66, a sled test 68, a FEA model 70, a second Hybrid III dummy 72, a second Hybrid III dummy model 74, and a vehicle crash. Each of the tools is used during the development of a restraint system at different times of the vehicle restraint system development cycle.

A design of a restraint system begins with the formulation of an initial vehicle model. This model includes vehicle interior geometry as well as material properties related to vehicle components. These material properties can include well known parameters such as instrument panel geometry, strength and seat locations. Additionally, associated with the restraint model are a series of deceleration pulses which are indicative of various vehicle crash situations. This model is used to formulate the FEA crash model 70. The model is additionally used to configure the test set up for the sled crash test.

As described above, a FEA model 66 of the first Hybrid III dummy 64 is produced. This FEA model 66 is incorporated into the FEA crash model 70. A series of crash tests 82 are conducted using the first Hybrid III dummy. The results of the tests are used to formulate, tune, and adjust the variables of the crash model to formulate a functional computer model of the vehicle 84. This computer model can then be used to adjust restraint system parameters such as inflation output, cushion size, and seat belt parameters. Once the restraint system design is finalized, the restraint system can be rechecked using a sled test 86.

At this point, a second Hybrid III model 74 can be incorporated 88 into the FEA crash model. This Hybrid III 74 model can be, for example, a model related to another crash test dummy at another testing facility, which may be, for instance, overseas. The resultant test data using the second Hybrid III model 74 can be determined. If the tolerance of the system is sensitive to the change in dummy models, then changes to the restraint system can be entertained to ensure proper government system compliance.

Thus, the present teachings provide for a test model that is calibrated for a specific individual anthropomorphic test dummy. The model is formed of finite elements. These elements typically have static material properties. The model of the present teachings is able to change these properties as they are a function of time or environmental conditions. As the dummy goes through regular testing required by the relevant governmental regulatory authorities, the model is also adjusted based on the test data. When a component of the dummy is replaced, such as a leg, the finite element model is modified accordingly and the time function is changed for the leg only. This provides an up to date finite element model that replicates the dynamic properties of the specific anthropomorphic dummy.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A method of forming a computer model for a vehicle crash event, said method comprising the steps of:
   providing a first model of a first anthropomorphic dummy formed of first and second linked physical components, said first model of the first anthropomorphic dummy being formed of first and second elements, said first element comprising a data structure stored in a first computer memory location indicative of a first material property that changes as a function of time, said second element comprising a second data structure stored in a second computer memory located indicative of a second material property that changes as a function of time;
   associating with said first element a first counter indicative of the age of the first linked component;
   associating with said second element a second counter indicative of the age of the second linked component;
   using the first counter and the second counter in conjunction with the material property for the first element and second element in the first model of the first anthropomorphic dummy;
   forming a vehicle model of a vehicle; and
   incorporating the first model of the first anthropomorphic dummy in the vehicle model to simulate a vehicle crash event.

2. The method according to claim 1, further comprising producing a second model of a second physical structure formed of the first physical component and a third physical component, said second model formed of the first element and a third element, said third element comprising a third data structure stored in a third computer memory location, said third data structure being indicative of a third material property that changes as a function of time, said third element having a third counter indicative of the age of the third physical component.

3. The method according to claim 1, wherein the first and second components are components of the first anthropomorphic dummy.

4. The method according to claim 2, wherein the second model is a model of a second anthropomorphic dummy.

5. The method according to claim 2, further comprising forming the vehicle model to include a vehicle interior and a restraint system.

6. The method according to claim 5, further comprising defining a plurality of material properties which are of function of time for the vehicle model.

7. The method according to claim 6, further comprising assigning the plurality of material properties to the first element, and assigning a definable time value to the first element.

8. The method according to claim 5, further comprising correlating the vehicle model using the first anthropomorphic dummy model, and running a simulation with the second anthropomorphic dummy model.

9. The method according to claim 8, wherein the first anthropomorphic dummy model is a first Hybrid III anthropomorphic dummy model, and the second anthropomorphic dummy model is a second Hybrid III anthropomorphic dummy model.

10. The method according to claim 9, further comprising running a crash test using the second anthropomorphic dummy model.

11. A method of designing a crash restraint system, said method comprising the steps of:
    forming a first computer model of a first Hybrid III anthropomorphic dummy, said first computer model comprising a first plurality of elements, each element of the first plurality of elements being associated with a first data structure stored in a first memory location, said first data structure containing a first set of data indicative of a first material property which changes with time;
    forming a second computer model of a second Hybrid III anthropomorphic dummy, said second computer model comprising a second plurality of elements, each element of the second plurality of elements being associated with a second data structure stored in a second memory location, said second data structure containing a second set of data, different from the first set of data, indicative of a second material property which changes with time;
    forming a vehicle model of a vehicle including a restraint system and having a plurality of elements with definable material properties;
    incorporating the first computer model of a Hybrid III into the vehicle model;
    correlating the vehicle model by adjusting the definable material properties in response to the results of a crash test;
    adjusting restraint system parameters of the restraint system using the vehicle model;
    incorporating the second computer model of a Hybrid III into the vehicle model; and
    evaluating the crash worthiness of the vehicle using the second computer model to determine whether changes need to be made to the restraint system.

12. The method according to claim 11, wherein the first material property is a dimensional property.

13. The method according to claim 11, wherein the first material property is one of stiffness, density, shape, volume.

14. The method according to claim 11, wherein the first material property is a material property of a material selected from the group vinyl, urethane, and polymer foam.

15. The method according to claim 11, further comprising removing the first computer model of a Hybrid III anthropomorphic dummy from the vehicle model prior to evaluating the crash worthiness of the vehicle.

* * * * *